(12) United States Patent
Nam

(10) Patent No.: US 7,289,784 B2
(45) Date of Patent: Oct. 30, 2007

(54) ACTIVE TUNABLE FILTER CIRCUIT

(75) Inventor: Sueng-il Nam, New Malden (GB)

(73) Assignee: NXP B.V., Eindhoven (NL)

( * ) Notice: Subject to any disclaimer, the term of this patent is extended or adjusted under 35 U.S.C. 154(b) by 485 days.

(21) Appl. No.: 10/238,796

(22) Filed: Sep. 10, 2002

(65) Prior Publication Data

US 2003/0054792 A1    Mar. 20, 2003

(30) Foreign Application Priority Data

Sep. 13, 2001    (GB) ................................ 0122227.2

(51) Int. Cl.
*H04B 1/16*    (2006.01)
(52) U.S. Cl. .................... 455/339; 455/340; 330/292
(58) Field of Classification Search .............. 330/291, 330/292, 305, 311, 306; 455/180.1–3, 188, 455/190.1, 191.5, 195, 193.1, 193.2, 280, 455/283, 284, 307, 337, 339, 340, 341
See application file for complete search history.

(56) References Cited

U.S. PATENT DOCUMENTS

| | | | | | |
|---|---|---|---|---|---|
| 3,849,677 | A | * | 11/1974 | Stacey et al. ................ 327/552 |
| 4,404,686 | A | * | 9/1983 | Moon ....................... 455/191.2 |
| 4,408,348 | A | * | 10/1983 | Theriault .................. 455/180.1 |
| 5,159,287 | A | * | 10/1992 | Furutani et al. ............. 330/286 |
| 5,280,638 | A | * | 1/1994 | Porambo et al. ............. 455/143 |
| 5,325,019 | A | * | 6/1994 | Miller et al. ............. 315/111.21 |
| 6,232,847 | B1 | * | 5/2001 | Marcy et al. ................ 331/167 |
| 6,417,740 | B1 | * | 7/2002 | Anh et al. ..................... 331/48 |
| 6,509,799 | B1 | * | 1/2003 | Franca-Neto ............... 330/305 |
| 6,573,788 | B2 | * | 6/2003 | Oppelt ...................... 330/61 A |
| 6,624,484 | B2 | * | 9/2003 | Christensen ................ 257/390 |
| 6,819,941 | B2 | * | 11/2004 | Dening et al. ............ 455/552.1 |
| 2001/0008383 | A1 | * | 7/2001 | Nishida et al. ............. 330/294 |

* cited by examiner

*Primary Examiner*—Edward F. Urban
*Assistant Examiner*—Nhan T. Le

(57) ABSTRACT

An active tunable filter circuit for use as an integratable active filter in a mobile radio apparatus, comprises an active amplifier circuit (A) including a reactive feedback network including a first tunable element (L1) set to pass with amplification a wanted input signal, and a passive resonant circuit (P) coupled to the active amplifier circuit and including an inductive element ($L_{FB}$, L3 or L4) and an inactive semiconductor element (FET2, FET3 or FET4) having an interelectrode capacitance which in operation resonates with the inductive element at a harmonic of the wanted signal. In one configuration (FIG. 1) the circuit comprises a band pass filter with amplification and in another configuration (FIG. 6-not shown) the circuit comprises a harmonic notch filter with amplification.

9 Claims, 3 Drawing Sheets

ACTIVE TUNABLE FILTER CIRCUIT

The present invention relates to an active tunable filter circuit having applications in multi-band mobile radio communications applications.

With the introduction of multi-band mobile radio systems, such as GSM and DCS, there is a requirement for handsets to operate on at least two separate systems. Technical developments relating to circuits for use in hand sets to improve sub-system performance have focused on impedance matching techniques and efficient power amplifier design which have lead to reduced power dissipation and improved efficiency of RF sub-systems. The impedance matching techniques still require a plurality of RF filters for each individual frequency band within multi-band communication systems. There have been two different approaches to implementing tunable elements for filtering applications, namely, passive tunable component design and active inductor and capacitor design. Drawbacks to passive tunable component design are that it is still evolving and it is currently not possible to achieve the required wide tuning range. Although the active inductor and capacitor design technique is developed, the technique is characterised with high parasitics, leading to low Q design which results in fundamental performance limitations in many component designs. As a consequence separate filtering chains have been used in multi-band mobile radio systems in order to differentiate the individual frequency bands. In many cases for mobile handsets, the individual RF filter chains are implemented using SAW techniques. Such techniques are not only expensive but also such filter modules require special integration techniques to enable the SAW filters to be integrated with other parts, such as power amplifiers, of the RF sub-assembly. This conventional RF module design with individual RF filter chains is relatively a high cost solution having a high power dissipation and relatively large size.

An object of the present invention is to overcome these drawbacks in the known filter design.

According to the present invention there is provided an active tunable filter circuit comprising an amplifying element having a reactive feedback network including a tunable element for amplifying an input signal, and a resonant circuit including an inductive element and the interelectrode capacitance of an inactive semiconductor device which in operation resonates with the inductive element to provide filtering at a harmonic of the input signal.

The present invention is based on the realisation that it is possible to make an active tunable filter circuit having amplification-like filtering with low noise figure using high Q reactive feed back which makes use of the parasitics of a semiconductor active element such as a transistor, for example a FET, to provide a very low value capacitance in order to provide a circuit capable of resonating at harmonics of frequencies such as 900 MHz and higher.

BRIEF DESCRIPTION OF DRAWINGS

The present invention will now be described, by way of example, with reference to the accompanying drawings, wherein:

In the drawings the same reference numerals have been used to indicate corresponding features.

Referring to FIG. 1 the active tunable filter illustrated comprises an active amplification and filtering part A and a passive resonator part P providing harmonic filtering.

Figure 1:
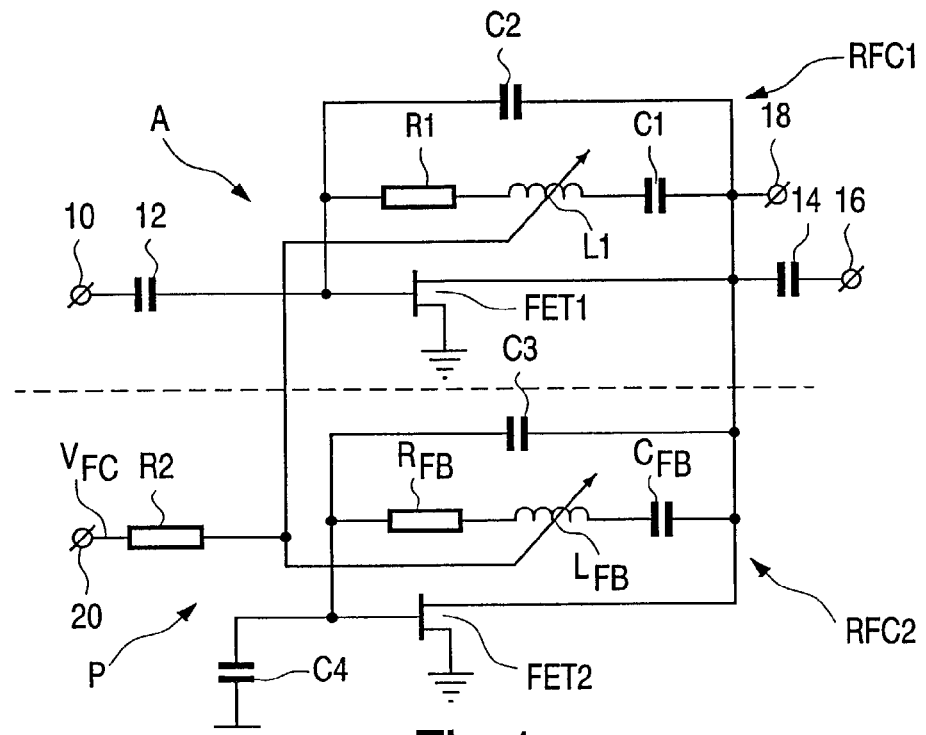
FIG. 1 is a schematic circuit diagram of a first embodiment of an active tunable filter for multi-band mobile radio communications.

The active part A comprises an active semiconductor amplification device such as FET1. An input terminal 10 receives an RF input signal which is applied by way of a capacitor 12 to the gate electrode of FET 1. The source electrode of FET1 is coupled to ground and its drain electrode is coupled by way of a capacitor 14 to an RF output terminal 16. A source of drain bias voltage (not shown) is coupled to a terminal 18 which is directly connected to the drain of FET1.

A reactive feedback circuit RFC1 is coupled between the drain and gate electrodes of the FET1. The reactive feedback circuit RFC1 comprises a dc blocking capacitor C1, a variable inductance L1 and a resistor R1 connected in series between the drain and gate electrodes of FET1. A capacitor C2 is connected in parallel with the series chain. A source of frequency control volts $V_{FC}$ (not shown) on a terminal 20 is applied to a control electrode of the variable inductance L1 by way of a series resistor R2. The variable inductance L1 is set to pass the wanted RF signals present on the input terminal 10.

The passive resonator part P comprises a non conductive, semi-conductor device FET2 having a reactive feedback network RFC2 comprising a dc blocking capacitor $C_{FB}$, a variable inductance $L_{FB}$ and a resistor $R_{FB}$ connected in series between the drain and source electrodes of FET2. A capacitor C3 is connected in parallel with the series chain. The gate of FET2 is coupled to ground by way of a capacitor C4 and is not driven with any drain bias voltage. Consequently FET2 is in a passive mode. A control electrode of the variable inductor $L_{FB}$ is coupled to the terminal 20 by way of the resistor R2.

In operation the drain bias voltage is applied to the terminal 18 and a frequency control voltage $V_{FC}$ is applied to the terminal 20. An RF input signal on the terminal 10 is bandpass filtered and the result appears on the terminal 16.

Figure 2:
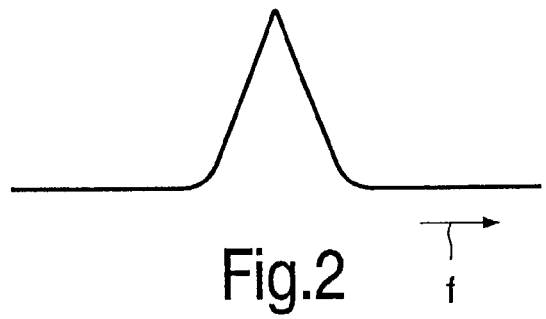
FIG. 2 is a graph showing a bandpass response obtainable with the first embodiment of the active tunable filter.

The reactive feedback circuit RFC2 of the passive part P effectively shunts the reactive feedback circuit RFC1 of the active part A and gives infinite impedance at the wanted frequency. This is shown in FIG. 2. The resonant frequency of the filter is determined by the feedback inductance $L_{FB}$ resonating with the gate-drain parasitic capacitance $C_{gd}$ of the non-conductive FET2. The feedback resistor $R_{FB}$ has a small value to provide stability. The variable inductance $L_{FB}$ has a value significantly different from that of the variable inductance L1 in order that the resonant circuit formed by the inductance $L_{FB}$ and the parasitic capacitance $C_{gd}$ resonates at the second or higher harmonic of the signal present on the input terminal 10.

Figure 3:
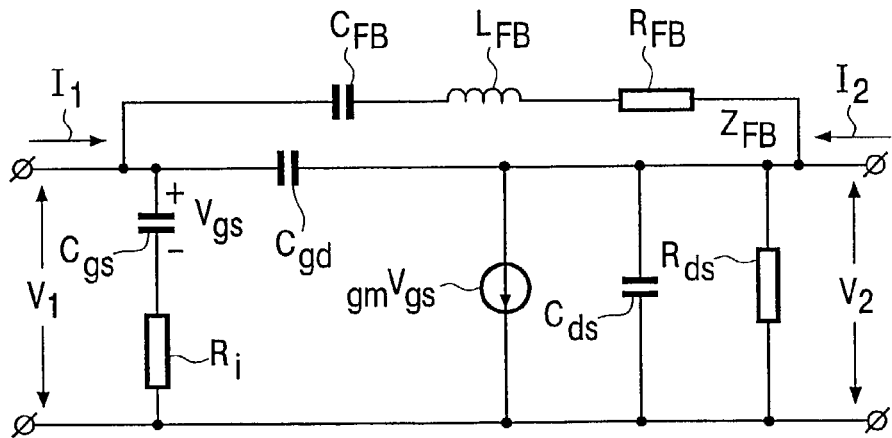
FIG. 3 is a diagram of the feedback circuit shown in FIG. 1 with only the parasitics in the case of a FET.

Referring to FIG. 3, an explanation will be given of the operation of the resonating circuit. When the resistor $R_{FB}$ has a small value, the feedback impedance is completely dominated by the feedback reactance value so that the circuit is working in a reactive feedback mode. Consequently the feedback inductance $L_{FB}$ interacts with the parasitics of a transistor, in this case FET2. In order to facilitate an understanding of the reactive mode the analytical expressions below consider only the intrinsic parameters of FET2. Thus the feedback circuit is represented as shown in FIG. 3.

By using well known conversion formulas between two port network parameters and the expression for maximum stable gain (MSG), the MSG is expressed as:

$$MSG = \frac{\left|g_m - \left(\frac{1}{Z_{gd}} + \frac{1}{Z_{FB}}\right)\right|}{\left|\frac{1}{Z_{gd}} + \frac{1}{Z_{FB}}\right|}$$

where $g_m$ is the transconductance of the equivalent circuit of FET2 in FIG. 3, $Z_{gd}$ is the gate-drain impedance of FET2, and $Z_{FB}$ is the impedance of the reactive feedback network RFC2. When $$\left|\frac{1}{Z_{gd}} + \frac{1}{Z_{FB}}\right| = 0,$$

MSG reaches infinity.

$$\frac{1}{Z_{gd}} + \frac{1}{Z_{FB}} = \frac{j\omega C_{gd} - \omega^2 C_{gd} C_{FB}(R_{FB} + j\omega L_{FB}) + j\omega C_{FB}}{1 + j\omega C_{FB}(R_{FB} + j\omega L_{FB})}$$

where all the possible reactance components of the feedback loop have been considered, so that $C_{FB}$, $L_{FB}$ and $R_{FB}$ are the feedback capacitance, inductance and resistance, respectively. In the case where $R_{FB}=0$ (reactive feedback) or $R_{FB} \ll |\omega L_{FB}|$, $$\frac{1}{Z_{gd}} + \frac{1}{Z_{FB}} = \frac{j\omega C_{FB}(1 - \omega^2 C_{gd} L_{FB}) + j\omega C_{gd}}{1 - \omega^2 C_{FB} L_{FB}}$$

When a low value of $R_{FB}$ (below a threshold value $R_K$) is selected, the feedback inductance $L_{FB}$ can resonate with $C_{FB}$ at a frequency where $\omega^2 C_{FB} L_{FB} = 1$ creating extremely high gain with unconditional stability. Simulations confirm this ultra high gain design principle, when ten different $R_{FB}$ values have been swept at two different $L_{FB}$ values.

Figure 4:
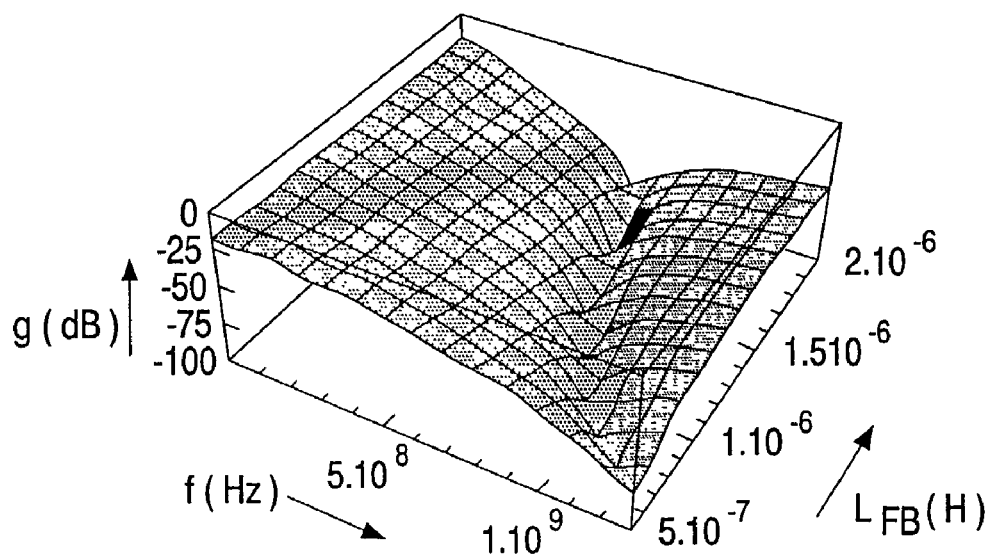
FIG. 4 shows the $S_{12}$ simulated results of the reactive feedback.
Figure 5:
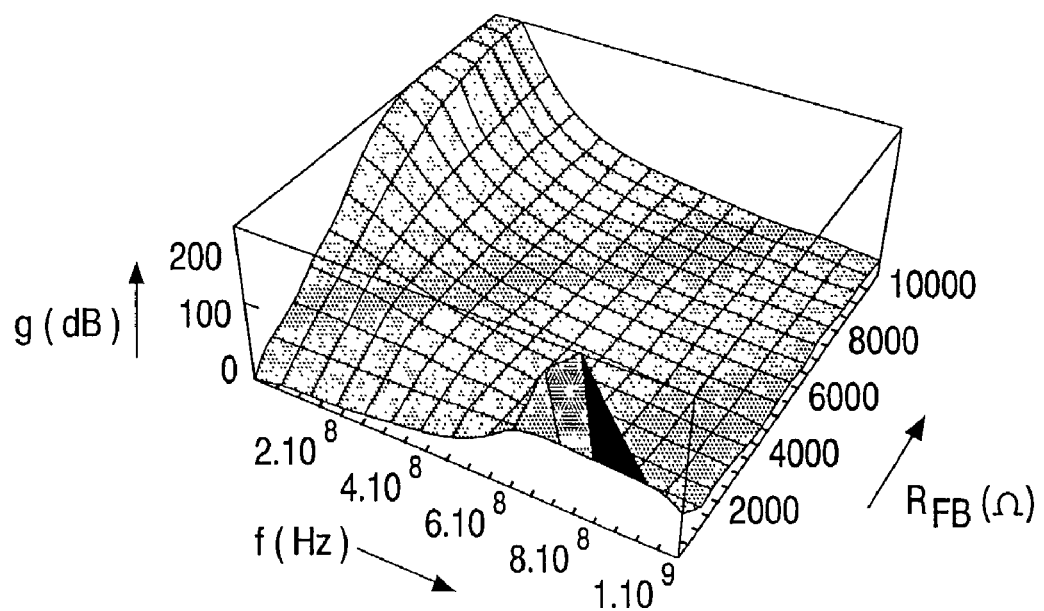
FIG. 5 shows the $S_{21}$ simulated results of the reactive feedback.

FIGS. 4 and 5 present the calculated results. FIG. 4 shows the reverse gain $S_{12}$, that is, gain g in dB versus frequency f in Hz versus the feedback impedance $L_{FB}$ in Henries, and FIG. 5 shows the forward gain $S_{21}$, that is, gain g in dB versus frequency f in Hz versus the feedback resistance $R_{FB}$ in ohms (Q). An examination of FIGS. 4 and 5 shows that a very high gain is obtained with stability due to resonance (as $S_{12}$ goes to zero, $S_{21}$ increases). The calculation clearly shows that the reactive feedback amplifier can produce extremely high gain.

Figure 6:
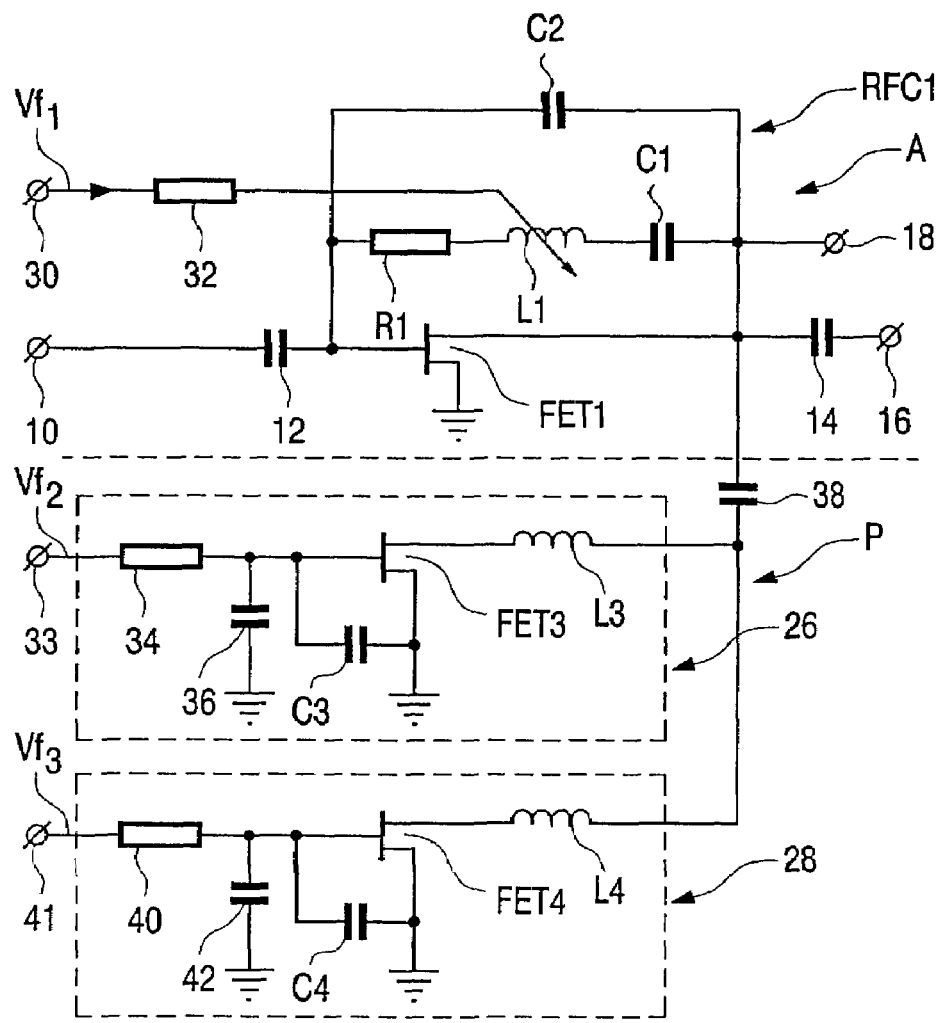
FIG. 6 is a schematic circuit diagram of a second embodiment of an active filter for multi-band mobile radio communications.

Referring to FIG. 6, the active filter shown functions as a harmonic notch filter because the respective junction capacitances of FET3 and FET4 resonate with respective inductances L3 and L4, which are external of their respective FETs.

The active part A of the illustrated circuit resembles that described with reference to and shown in FIG. 1 and in the interests of brevity only the differences will be described. The active part is tuned to the wanted RF input signal by applying a tuning voltage $Vf_1$ on a terminal 30 to a control electrode of the inductance L1 by way of a series resistor 32.

The passive part comprises two circuits 26, 28 based on non-conductive FET3 and FET4, the outputs of which are coupled by way of a series capacitor 38 to a junction of the drain electrode of the FET1 and the capacitor 14.

The circuits 26, 28 have the same architectures and in the interests of brevity the circuit 26 will be described in detail and the corresponding components in the circuit 28 will be referred to in parentheses.

An input terminal 33 (41) for a tuning voltage $Vf_2$ ($Vf_3$) is coupled by a series resistor 34 (40) to the gate electrode of the FET3 (FET4). An inductance L3 (L4) is coupled by one end to the drain electrode of the FET3 (FET4) and by its other end to the capacitor 38. The source electrode of the FET3 (FET4) is connected to ground. A capacitor C3 (C4) shunts the gate-source capacitance of the FET3 (FET4). A capacitance 36 (42) is coupled between the resistor 32 (40) and ground.

Figure 7:
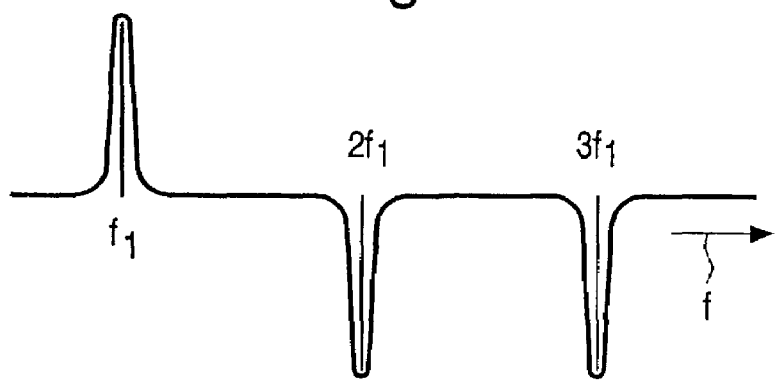
FIG. 7 is a graph of the frequency response of the second embodiment of the active filter.

The tuning voltages $Vf_2$ and $Vf_3$ correspond to the second and third harmonics $f_2$ and $f_3$ of the fundamental frequency $f_1$. When the voltages $Vf_1$, $Vf_2$ and $Vf_3$ are applied to their respective input terminals 30, 33 and 41, the active tunable filter circuit behaves as a harmonic notch filter with a characteristic as shown in FIG. 7.

The feedback amplifier's noise parameters are:

$$R_n^F = \left|\frac{y_{21}}{y_{21} - y_{FB}}\right|^2 \left(R_n + \left|\frac{y_{FB}}{y_{21}}\right|^2 R_{FB}\right)$$

$$G_n^F = G_n + |y_{11} + y_{21} - y_{cor}|^2 \frac{\left|\frac{y_{FB}}{y_{21}}\right|^2 R_n R_{FB}}{R_n + \left|\frac{y_{FB}}{y_{21}}\right|^2 R_{FB}}$$

$$y_{cor}^F = y_{cor} + (y_{11} + y_{21} - y_{cor}) \frac{\frac{y_{FB}}{y_{21}} R_n + \left|\frac{y_{FB}}{y_{21}}\right|^2 R_{FB}}{R_n + \left|\frac{y_{FB}}{y_{21}}\right|^2 R_{FB}}$$

where $R_n$, $G_n$ and $Y_{cor}$, respectively, are the equivalent noise resistance, the equivalent noise conductance and the correlation admittance of the FET2 without the feedback network RFC2. The above equations are valid when $R_{FB} \cong |\omega L_{FB}|$. This means that the inserted feedback elements generate extra noise (noise source), resulting in a contribution of noise to the amplifier. In the reactive mode ($R_{FB} \ll |\omega L_{FB}|$), the parameters can be simplified as $$R_n^F = \left|\frac{y_{21}}{y_{21} - y_{FB}}\right|^2 (R_n)$$

$$G_n^F = G_n$$

$$y_{cor}^F = y_{cor} + (y_{11} + y_{21} - y_{cor}) \frac{y_{FB}}{y_{21}}$$

The amplifier noise is thus reduced, but the reactance component still functions as a noise source.

Compared to the prior art filters discussed in the preamble of this specification, the active tunable filter circuit made in accordance with the present invention has the benefits of a single circuit providing resonator type amplification with suppressed spurious attenuation and rejected harmonics, a low noise figure, and a tunable frequency and gain for mobile applications and capable of being manufactured as an integrated circuit using a standard foundry process.

Although the present invention has been described with reference to using FETs, it is to be understood that other active semiconductor devices may be used such as junction transistors.

A primary application of the active tunable filter circuit described above is as a front end of a RF stage in a radio receiver. However if sufficiently rugged active semiconductor devices are available the tunable active filter circuit made in accordance with the present invention may be used in a power amplifier circuit to provide an amplifier circuit with filtering.

In the present specification and claims the word "a" or "an" preceding an element does not exclude the presence of a plurality of such elements. Further, the word "comprising" does not exclude the presence of other elements or steps than those listed.

From reading the present disclosure, other modifications will be apparent to persons skilled in the art. Such modifications may involve other features which are already known in the design, manufacture and use of active tunable filter circuits and component parts therefor and which may be used instead of or in addition to features already described herein.

The invention claimed is:

1. An active tunable filter circuit comprising an active amplifying element having a reactive feedback network coupled from the output to the input of the active amplifying element and including a tunable element for amplifying an input signal, and a passive resonant circuit shunting said reactive feedback network and including an inductive element and the interelectrode capacitance of an inactive semiconductor device wherein said capacitance of the inactive semiconductor device in operation resonates with the inductive element to provide filtering at a harmonic of the input signal.

2. A circuit as claimed in claim 1, characterised in that the resonant circuit further comprises a capacitance shunting the interelectrode capacitance.

3. A circuit as claimed in claim 2, characterised by the resonant circuit having a resistive element in series with the inductive element.

4. A circuit as claimed in claim 2, characterised in that the tunable element and the inductive element have respective control electrodes and in that the control electrodes are coupled to an input for receiving a frequency control voltage.

5. A circuit as claimed in claim 2, characterised in that the first tunable element is a variable inductance.

6. A circuit as claimed in claim 1, characterised in that the resonant circuit includes an inductance coupled in series with a capacitance.

7. A circuit as claimed in claim 1, characterised by at least two resonant circuits, each resonant circuit having an input coupled to an input terminal for connection to a respective frequency control voltage and an output coupled to an output of the reactive feedback network.

8. A module comprising an active tunable filter circuit as claimed in claim 1.

9. A radio communications apparatus comprising an active tunable filter circuit as claimed in claim 1.

* * * * *